United States Patent [19]

Chikasue

[11] Patent Number: 4,715,043
[45] Date of Patent: Dec. 22, 1987

[54] CROSS-COIL TYPE INDICATING INSTRUMENT

[75] Inventor: Hideo Chikasue, Shimada, Japan

[73] Assignee: Yazaki Corporation, Japan

[21] Appl. No.: 899,318

[22] Filed: Aug. 22, 1986

[51] Int. Cl.$^4$ .................. G08C 5/30; H03K 17/96
[52] U.S. Cl. ............................ 374/184; 307/309; 324/144
[58] Field of Search .............. 374/176, 153, 184, 145

[56] References Cited

U.S. PATENT DOCUMENTS

| | | | |
|---|---|---|---|
| 3,330158 | 7/1967 | Simonyan et al. | 374/176 X |
| 3,624,625 | 11/1971 | Stonestreet | 324/144 X |
| 3,701,136 | 10/1972 | Stevens et al. | 336/30 |
| 3,987,318 | 10/1976 | Meijer | 374/178 X |
| 4,095,468 | 6/1978 | Sidor | 374/184 |
| 4,199,696 | 4/1980 | Tanaka et al. | 307/309 |

FOREIGN PATENT DOCUMENTS 58-17258 4/1983 Japan .
58-156274 10/1983 Japan .

Primary Examiner—Daniel M. Yasich
Attorney, Agent, or Firm—Wigman & Cohen

[57] ABSTRACT

A cross-coil type indicating instrument has a permanent magnet arranged in a plurality of coils that are wound mutually crossed and indicates the value corresponding to a physical quantity detected by a sensor through turning the permanent magnet by supplying to the coil the electrical signal that corresponds to the sensor output. Two of the plurality of coils are wound so as to generate respectively magnetic fields which have mutually opposite direction, and the currents supplied to the coil are independently controlled by first and second control circuit, wherein the first control circuit comprises a input circuit and a operating circuit for low temperature and the second circuit comprises a input circuit and a operating circuit for high temperatures.

11 Claims, 9 Drawing Figures

CROSS-COIL TYPE INDICATING INSTRUMENT

BACKGROUND OF THE INVENTION

1. Field of the Invention

The present invention relates to a cross-coil type indicating instrument which has a magnet arranged in a plurality of coils that are wound mutually crossed, and indicates the value of a detected physical quantity such as temperature by means of the rotation of the magnet caused by the electrical signal that corresponds to the sensor output supplied to the coils.

2. Description of Prior Art

The cross-coil type indicating instrument is being used, for example, as the water temperature meter of motor vehicles.

In the water temperature meter, a permanent magnet which acts as the pointer is provided in a plurality of coils that are wound mutually crossed. The electrical current which corresponds to the output of the temperature sensor is supplied to the coils to rotate the permanent magnet. In operation, when the water temperature is raised from a low temperature, a current that corresponds to the water temperature is supplied to each of the coils, and the permanent magnet is rotated to indicate the water temperature. Then, when the water temperature reaches the steady-state temperature for normal driving of the motor vehicle, for instance, 82° C. to 110° C. or so, the electrical signal to each of the coils become constant, and so becomes the indication angle of the pointer.

However, when the water temperature goes up further, the electrical signal that is supplied to each of the coils is changed again, and the pointer is rotated further in the same direction to indicate the corresponding higher temperature. Consequently, according to the present water temperature meter, it is arranged that the water temperature is displayed if it is too low or too high; and it is arranged that the pointer will not show fluctuations due to minor ups and downs of the water temperature at the steady-state driving temperature. Therefore, during a normal driving of the motor vehicle, it is unnecessary to worry about the conditions of the water temperature.

However, in such a system, the control circuit for controlling the supply of the current to each of the coils has an elementary configuration. Consequently, the range of the temperature for normal driving is susceptible to easy variation due to the dispersion in the characteristic properties of the circuit elements used, so that a problem with the system arose in that the desired indication precision was not realized.

SUMMARY OF THE INVENTION

An object of the present invention which is aimed at resolving the above-mentioned problems is to provide a cross-coil type indicating instrument in which the range of the detected physical quantity that is to give a constant indication angle of the pointer, does not fluctuate easily, so that it is possible to realize a desired precision of indication.

Another object of the present invention is to provide a cross-coil type indicating instrument which makes it possible to adjust, if so desired, the range of the physical quantity to be detected for which the indication angle of the pointer has a constant value.

Another object of the present invention is to provide a cross-coil type indicating instrument which has a strong holding force of the magnet so that the pointer will not be made to fluctuate easily by external vibrations or the like.

Another object of the present invention is to provide a cross-coil type indicating instrument which makes it possible, when the indication angle of the pointer varies in response to the detected value of the sensor, to adjust the rate of change of the indication angle.

In order to achieve the above-mentioned objects, the cross-coil type indicating instrument of the present invention, which has a magnet in a plurality of coils wound mutually crossed, the magnet being rotated by the electrical signal that corresponds to the output of a sensor, is given the following configuration. Namely, the indicator comprises (i) a first coil which is wound so as to generate a prescribed magnetic field $H_1$ and is excited all the time, (ii) a second coil which is wound in such a way as to generate a magnetic field $H_2$ that crosses with the magnetic field $H_1$, (iii) a third coil which is wound in such a way as to generate a magnetic field $H_3$ that is in nearly opposite direction to the magnetic field $H_2$, (iv) a first control circuit which compares the sensor output with a first reference value, and supplies a current that is in a prescribed functional relationship with the said output to the second coil until the output reaches the first reference value, and interrupts the supply of the current when the output exceed the first reference value, and (v) a second control circuit which compares the sensor output with a second reference value that is greater than the first reference value, does not supply a current until the output reaches the second reference value, and supplies a current that is in a prescribed functional relationship with said output to the third coil after the output exceeds the second reference value.

According to the present invention that is mentioned above, the first through the third coils are designed to be excited separately, and the second and the third coils are controlled by the first and second control circuits that operate with high precision. Consequently, the relationship between the detected value by the sensor and the indication angle can be adjusted with ease, and the detected value can be indicated with high precision.

These and other objects, features and advantages of the present invention will be more apparent from the following description of a preferred inventions, taken in conjunction with the accompanying drawings.

DESCRIPTION OF THE PREFERRED EMBODIMENT

Figure 1:
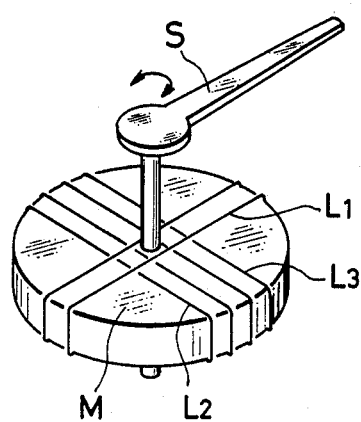
FIG. 1 is a perspective view of the main part of the indication unit of the cross-coil type indicating instrument of a prior art example and for an embodiment of the present invention.

Referring to FIG. 1, there are provided wound coils $L_2$ and $L_3$ that generate magnetic fields that are in mutually opposite directions, and a coil $L_1$ which generates a magnetic field that is perpendicular to the magnetic field that are generated by the coils $L_2$ and $L_3$. In the interior of the coils $L_1$, $L_2$, and $L_3$, there is provided a permanent magnet M with a pointer S, which can be rotated by the magnetic fields generated by these coils $L_1$, $L_2$, and $L_3$.

Figure 2:
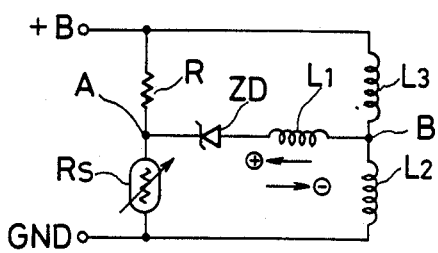
FIG. 2 is a circuit diagram illustrating the prior art cross-coil type indicating instrument.

In the prior art cross-coil type indicating instrument, there is provided a circuit as shown in FIG. 2 for operating the indication unit. In FIGS. 1 and 2, coils $L_2$ and $L_3$ that are wound in mutually opposite directions are connected in series and are connected to a power source B. A resistor R and a temperature-sensitive resistor Rs that possesses a negative temperature characteristic such as a thermistor are connected in series with the constant voltage source B. The coils $L_2$ and $L_3$ and the resistors R and Rs are constructed to form a bridge circuit. Between the connecting points A and B there are connected a Zener diode ZD and a coil $L_1$ that are connected in series.

Figure 3:
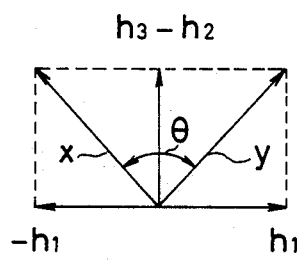
FIG. 3 is an explanatory diagram illustrating the magnetic field that is generated by the coils provided in the circuit of FIG. 2.

The operation of the prior art will now be described. With a change in the sensed temperature the resistance of the thermistor Rs varies. When the water temperature is low and the resistance of the thermistor Rs is large, the Zener diode ZD becomes conductive in the direction of the arrow, and there is generated a magnetic field $-h_1$ due to the coil $L_1$ in addition to a magnetic field $(h_3-h_2)$ due to the coils $L_2$ and $L_3$, as shown in FIG. 3. The resultant magnetic field x of the magnetic fields $-h_1$ and $h_3-h_2$ is applied to the rotating permanent magnet M and determines the position of the pointer S shown in FIG. 1.

Next, when the water temperature rises gradually and the potential difference between the connection points A and B becomes lower than the Zener voltage which does not induce the conduction of the Zener diode ZD, there will not flow a current in the coil $L_1$. Hence, there is generated only the magnetic field $(h_3-h_2)$ due to the coils $L_2$ and $L_3$, and the pointer S indicates the point that corresponds to the magnetic field $(h_3-h_2)$ shown in FIG. 3.

WHen the water temperature is raised further, the resistance of the resistor Rs decreases, and corresponding to this the Zener diode ZD becomes conductive in the direction of the arrow "+". This results in the generation of the magnetic field $h_1$ in addition to the magnetic field $h_3-h_2$, and the pointer S carries out an indication that corresponds to the resultant magnetic field y of these field, as shown in FIG. 3.

Figure 4:
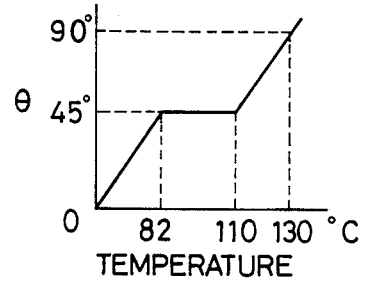
FIG. 4 is a graph illustrating the characteristics of the prior art cross-coil type indicating instrument.

Accordingly, the indication angle of the pointer of the prior cross-coil type indicating instrument varies with the rise in temperature as shown in FIG. 4.

However, in such a prior indicating instrument, the range of temperature or the like which keeps the indication of the pointer of a fixed position depends upon the Zener voltage of the Zener diode ZD. Accordingly, if there is a dispersion in the physical properties of the Zener diodes, then the range of the physical quantity which is to keep the pointer at a fixed position will vary, so that a sufficiently high precision of indication cannot be expected. In addition, indication of the pointer will vary due to dispersion in such parts as the resistor R and the coil $L_1$. Moreover, it is extremely difficult to change the slope of the characteristic curve.

Therefore, appearance of a cross-coil type indicating instrument that is free from these drawbacks has been desired for some time.

Figure 5:
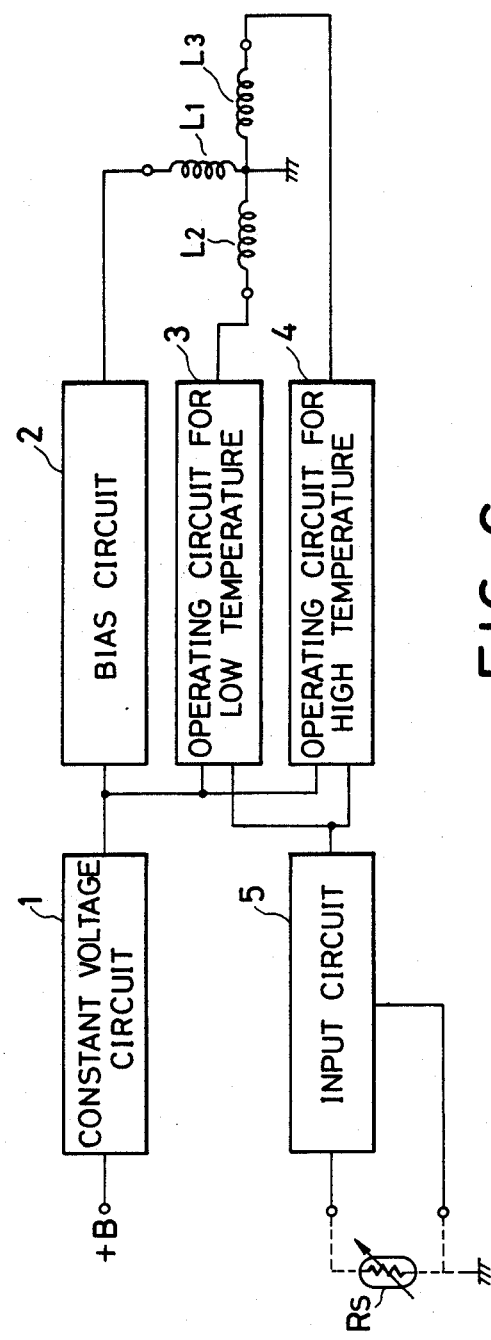
FIG. 5 is a block diagram illustrating the circuit configuration of the cross-coil type indicating instrument of the present embodiment of the invention.

An embodiment of the present invention will now be described. Referring to FIG. 5, in the circuit of the present embodiment which supplies electrical signals corresponding to the sensor output to the first, second, and third coils $L_1$, $L_2$, and $L_3$, respectively, there is provided a constant voltage circuit 1 for outputting a constant voltage which is obtained by stabilizing the +B voltage that is supplied by the battery unit of the motor vehicle.

Figure 6:
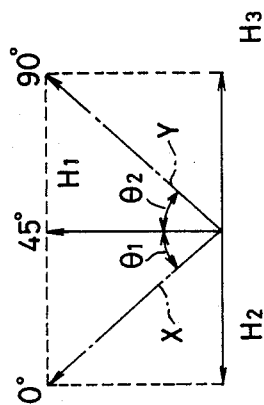
FIG. 6 is an explanatory diagram illustrating the magnetic field generated by the coil provided in the circuit of FIG. 5.

Between the constant voltage circuit 1 and the coil $L_1$, there is provided a bias circuit 2 which supplies a constant current to the coil $L_1$ all the time, based on the constant voltage, to excite the coil $L_1$ and to generate a magnetic field $H_1$ shown in FIG. 6.

In addition, between the constant voltage circuit 1 and the coil $L_2$, there is provided an operating circuit for low temperature 3 which operates in a prescribed temperature range from ambient temperature to 82° C. The operating circuit for low temperature 3 supplies a current that decreases with increase in temperature to the coil $L_2$, to excite it to generate a magnetic field $H_2$ shown in FIG. 6.

Moreover, between the constant voltage circuit 1 and the coil $L_3$, there is provided an operating circuit for high temperature 4 which is operated in a prescribed high temperature range above 110° C., say, and supplies a current that increases with increase in temperature to the coil $L_3$, to excite it to generate a magnetic field $H_3$ shown in FIG. 6.

Furthermore, the operating circuit for low temperature 3 and the operating circuit for high temperature 4 are connected to an input circuit 5 which converts the resistance value of the temperature-sensitive resistor Rs to a voltage by comparing the resistance with a reference resistance.

The input circuit 5 and the operating circuit for low temperature 3 operate as a control circuit (first control circuit) which control the current supplied to the second coil $L_2$ based on the variation of the resistance of the temperature sensitive resistor Rs. Also the input circuit 5 and the operating circuit for high temperature 4 operate as a control circuit (second control circuit) which control the current supplied to the third coil $L_3$ based on the variation of the resistance of the temperature sensitive resistor Rs.

Next, the operation of these circuits will be described.

First, in the low temperature range (from ambient temperature to about 82° C.), the resultant magnetic field x of a constant magnetic field $H_1$ that is generated by the coil $L_1$ through the bias circuit 2 and the magnetic field $H_2$ which is generated in the coil $L_2$ by the operating circuit for low temperature 3, varies in the range of angle $\theta_1$ shown in FIG. 6. As the magnetic field $H_2$ decreases with increase in temperature, the temperature indication is carried out by the deflection of the pointer, which rotates in the clock-wise direction.

Next, in a prescribed temperature range (roughly from 82° C. to 110° C.) between the low temperature range and the high temperature range, neither the operating circuit for low temperature 3 nor the operating circuit for high temperature 4 is activated. Since there is generated only the magnetic field $H_1$ in the coil $L_1$ by the bias circuit 2, the pointer indicates the fixed position at the deflection angle of 45° shown in FIG. 6.

Then, in the high temperature range (above 110° C.), the resultant magnetic field Y of the magnetic field $H_1$ generated by the coil $L_1$ due to the bias circuit 2 and the magnetic field $H_3$ generated by the coil $L_3$ due to the operating circuit for high temperature 4, varies in the range of angle $\theta_2$ shown in FIG. 6. As the magnetic field $H_3$ increases with increase in temperature, the pointer is again deflected to clock-wise direction to carry out temperature indication.

Figure 7:
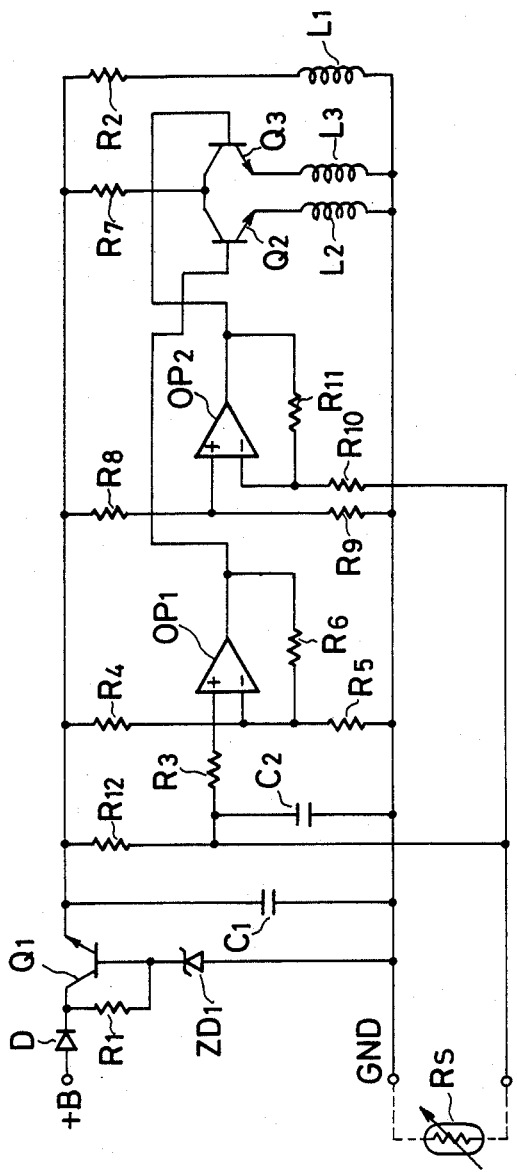
FIG. 7 is a diagram showing a circuit configuration for FIG. 5.

FIG. 7 shows a concrete example of the circuit shown in FIG. 5 as a block diagram. In the figure, a diode D, a resistor $R_1$, a capacitor $C_1$, a Zener diode $ZD_1$, and a transistor $Q_1$ form the constant voltage circuit 1 to supply a constant voltage. A resistor $R_2$ constitutes the bias circuit 2 that supplies a constant current to the first coil $L_1$.

A resistor $R_{12}$ forms a voltage divider together with the negative temperature-sensitive resistor Rs, and by which there is constituted an input circuit that converts the change in the resistance value of the resistor Rs to a voltage. Therefore, the output voltage of the input circuit decreases with an increase in the temperature.

The resistors $R_3$, $R_4$, $R_5$, $R_6$, and $R_7$, a transistor $Q_2$, and an operating amplifier $OP_1$ constitute the operating circuit for low temperature 3. When the voltage that is applied to one end of fthe resistor $R_3$ decreases with the increase in the detected temperature, the operating amplifier $OP_1$ behaves in such a way as to decrease its output voltage which reduces to zero when the input voltage becomes less than the reference voltage. The output voltage of the operating amplifier $OP_1$ is applied to the base of the transistor $Q_2$ to control its conduction to vary the current that flows in the coil $L_2$.

The resistors $R_8$, $R_9$, $R_{10}$, and $R_{11}$, a transistor $Q_3$, and an operating amplifier $OP_2$ constitute the operating circuit for high temperature 4. When the voltage that is applied to one end of the resistor $R_{10}$ is decreased with the increase in the detected temperature to a value below a prescribed value, the operating amplifier $OP_2$ operates to output a voltage which increases with the decrease in the input voltage. The output voltage of the operating amplifier $OP_2$ is applied to the base of the transistor $Q_3$ to control its conduction to vary the current that flows in the coil $L_3$.

A capacitor $C_2$ which is connected between the ground and the connecting point of the resistors $R_{12}$ and Rs integrates the output voltage of the input circuit.

Figure 8A:
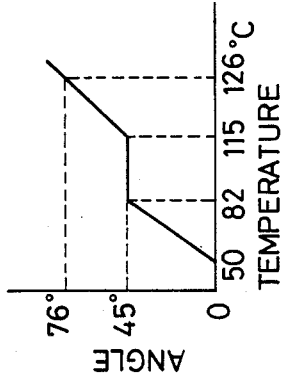
FIG. 8 (FIGS. 8a,8b) are graphs illustrating the characteristics of the cross-coil type indicating instrument equipped with the circuit shown in FIG. 7.
Figure 8B:
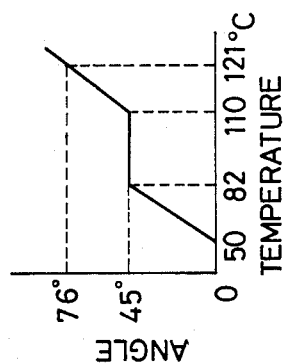

The temperature-scale characteristics are different for a gasoline car and a Diesel car, as shown in FIGS. 8(a) and 8(b), respectively. In this embodiment, however, it is possible to deal with the difference by varying the resistance of the resistor $R_8$.

Furthermore, choosing the resistance of $R_6$ and $R_{11}$ to be variable, it becomes possible by adjustment of these resistances to change the degree of amplification of the operating amplifiers to adjust the slopes of the temperature-scale characteristics.

As in the foregoing, indication is carried out by means of the composition of the magnetic fields that are generated by the first through the third coils that are excited independently. Therefore, there can be obtained effects in which it becomes very easy to carry out adjustments for realization of high precision, and to change the indication range and the slope of the temperature-scale characteristics.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A cross-coil type indicating instrument having a sensor having an output, a magnet, a plurality of mutually crossed coils wound around said magnet and connected to said output of said sensor, said instrument indicating a value of a detected physical quantity, as for example temperature, by means of a rotation of the magnet in response to an electrical signal that corresponds to the sensor output to the coils, comprising:
  (i) a first coil which is wound so as to generate a predetermined magnetic field $H_1$ and to be continuously excited,
  (ii) a second coil which is wound so as to generate a magnetic field $H_2$ that crosses the magnetic field $H_1$,
  (iii) a third coil which is wound so as to generate a magnetic field $H_3$ that is approximately in the opposite direction to the magnetic field $H_2$,
  (iv) a first control circuit having input terminals connected to said sensor and an output terminal connected to said second coil, for controlling only the current flow supplied to the second coil in accordance with a magnitude of the physical quantity detected by the sensor, said first control circuit controlling the current flow in such a manner that a magnitude of the current flow supplied to said second coil decreases with increase in the magnitude of the physical quantity detected until the magnitude of the physical quantity reaches a first reference value, and the current flow is interrupted after the magnitude of the physical quantity exceeds the first reference value, and
  (v) a second control circuit having input terminals connected to said sensor and having an output terminal connected to said third coil, for controlling only the current flow supplied to the third coil in accordance with the magnitude of the physical quantity detected by the sensor, said second control circuit controlling the current flow in such a manner that the current flow is not supplied to the third coil until an increasing magnitude of the physical quantity reaches a second reference value being greater than the first reference value, and after the magnitude of the physical quantity exceeds the second reference value a current flow whose magnitude increases with increase in the magnitude of the physical quantity, is supplied to said third coil.

2. The cross-coil type indicating instrument as claimed in claim 1, in which said second and third coils are wound approximately perpendicularly to said first coil.

3. The cross-coil type indicating instrument as claimed in claim 1, in which said sensor comprises a thermistor.

4. The cross-coil type indicating instrument as claimed in claim 1, in which said first and second control circuits have an input circuit which takes out the voltage between both ends of said thermistor as the output of the thermistor.

5. The cross-coil type indicating instrument as claimed in claim 4, in which said first control circuit comprises,
   a first operating amplifier receiving at the input terminal on the inverting side the first reference voltage which is the first reference value, and receiving at the input terminal on the noninverting side the voltage on both ends of the sensor, which is taken out by said input circuit, and
   a transistor which is operated by the voltage signal from the first operating amplifier and controls the amount of the current to said second coil, and
   said second control circuit comprises,
   a second operating amplifier receiving at the input terminal on the noninverting side the second reference voltage which is the second reference value, and receiving at the input terminal on the inverting side the voltage on both ends of said sensor, which is taken out by said input circuit, and
   a transistor which is operated by a voltage signal from the second operating amplifier and controls the amount of the current flow to said third coil.

6. The cross-coil type indicating instrument as claimed in claim 5, in which said first operating amplifier receives a negative feedback via a variable resistance.

7. The cross-coil type indicating instrument as claimed in claim 5, in which said second operating amplifier receives a negative feedback via a variable resistance.

8. The cross-coil type indicating instrument as claimed in claim 5, in which said second control circuit has a voltage divider for dividing the voltage from a constant voltage source into a variable low voltage, and the voltage from the voltage divider is input to the input terminal on the noninverting side as said second reference voltage.

9. A cross-coil type indicating instrument as claimed in claim 1, further comprising a battery, connected to input terminals of said first and second control circuits, for supplying current flows to said second and third coils.

10. A cross-coil type indicating instrument having a sensor having an output, a magnet, a plurality of mutually crossed coils wound around said magnet and connected to said output of said sensor, said instrument indicating a value of a detected physical quantity, as for example temperature, by means of a rotation of the magnet in response to an electrical signal that corresponds to the sensor output to the coils, comprising:
   (a) a first coil wound so as to generate a magnetic field $H_1$ that has magnitude and direction constant in time;
   (b) a second coil would so as to generate a magnetic field $H_2$ that crosses the magnetic field $H_1$;
   (c) a third coil wound so as to generate a magnetic field $H_3$ that is approximately in the opposite direction to that of the magnetic field $H_2$;
   (d) a first control circuit, having input terminals connected to the sensor, and having an output terminal connected to said second coil, for controlling only the current flow supplied to the second coil in accordance with a magnitude of the physical quantity detected by the sensor, said first control circuit controlling the current flow in such a manner that a magnitude of the magnetic field $H_2$ decreases with increase in the magnitude of the physical quantity detected until the magnitude of the physical quantity reaches a first reference value, and the current flow is interrupted after the magnitude of the physical quantity exceeds the first reference value; and
   (e) a second control circuit, having input terminals connected to the sensor, and having an output terminal connected to said third coil, for controlling only the current flow supplied to the third coil in accordance with the magnitude of the physical quantity detected by the sensor, said second control circuit controlling the current flow in such a manner that the current flow is not supplied to the third coil until an increasing magnitude of the physical quantity reaches a second reference value being greater than the first reference value, and after the magnitude of the physical quantity exceeds the second reference value a current flow is supplied to said third coil so that the magnitude of the magnetic field $H_3$ increases with increase in the magnitude of the physical quantity.

11. A cross-coil type indicating instrument having a sensor having an output, a magnet, a plurality of mutually crossed coils wound around said magnet and connected to said output of said sensor, said instrument indicating a value of a detected physical quantity, as for example temperature by means of a rotation of the magnet in response to an electrical signal that corresponds to the sensor output to the coils, comprising:
   (i) a first coil which is would so as to generate a predetermined magnetic field $H_1$ and to be continuously excited;
   (ii) a second coil which is would so as to generate a magnetic field $H_2$ that crosses the magnetic field $H_1$;
   (iii) a third coil which is would so as to generate a magnetic field $H_3$ that is approximately in the opposite direction to the magnetic field $H_2$;
   (iv) a first control circuit for controlling only the current flow supplied to the second coil in accordance with the magnitude of the physical quantity detected by the sensor, said first control circuit controlling the current flow in such a manner that a magnitude of the current flow supplied to said second coil decreases with increase in the magnitude of the physical quantity detected until the magnitude of the physical quantity reaches a first reference value and the current flow is interrupted after the magnitude of the physical quantity exceeds the first reference value; and
   (v) a second control circuit for controlling only the current flow supplied to the third coil in accordance with the magnitude of the physical quantity detected by the sensor, said second control circuit controlling the current flow in such a manner that the current flow is not supplied to the third coil until an increasing magnitude of the physical quantity reaches a second reference value, and after the magnitude of the physical quantity exceeds the second reference value a current flow whose magnitude increases with increase in the magnitude of the physical quantity, is supplied to said third coil;
   wherein said sensor is a thermistor and said first and second control circuits have a common input circuit which takes out a voltage between both ends of the thermistor as an output of the thermistor.

* * * * *

UNITED STATES PATENT AND TRADEMARK OFFICE
CERTIFICATE OF CORRECTION

PATENT NO. : 4,715,043
DATED : December 22, 1987
INVENTOR(S) : HIDEO CHIKASUE

It is certified that error appears in the above-identified patent and that said Letters Patent is hereby corrected as shown below:

IN THE CLAIMS:

Claim 10, line 12, "would" should be --wound--.

Claim 11, line 9, "would" should be --wound--;

line 12, "would" should be --wound--;

line 15, "would" should be --wound--.

Signed and Sealed this

Sixteenth Day of August, 1988

Attest:

DONALD J. QUIGG

Attesting Officer

Commissioner of Patents and Trademarks